United States Patent
Kitade et al.

[11] Patent Number: 6,025,998
[45] Date of Patent: Feb. 15, 2000

[54] METHOD FOR MANUFACTURING ELECTRONIC PARTS AND ELECTRONIC PARTS USING THE METHOD

[75] Inventors: Kazuhiko Kitade, Kaga; Masatoshi Koike, Komatsu, both of Japan

[73] Assignee: Murata Manufacturing Co., Ltd., Nagaokakyo, Japan

[21] Appl. No.: 09/066,670

[22] Filed: Apr. 28, 1998

[30] Foreign Application Priority Data

May 12, 1997 [JP] Japan ..................................... 9-120770
Apr. 13, 1998 [JP] Japan ................................. 10-101152

[51] Int. Cl.[7] ........................................................ H05K 9/00
[52] U.S. Cl. ..................... 361/800; 361/816; 361/818; 174/35 R; 257/659; 29/840; 29/843
[58] Field of Search ..................................... 361/800, 816, 361/818, 760; 174/35 R, 35 MS, 35 GC; 257/659, 660, 728, 730; 428/901; 29/840, 843

[56] References Cited

U.S. PATENT DOCUMENTS 4,572,757  2/1986  Spadafora ............................. 29/843 X
5,140,745  8/1992  McKenzie, Jr. ............................ 29/852
5,625,935  5/1997  Kubota et al. ........................ 29/25.42

FOREIGN PATENT DOCUMENTS

10-13078  1/1998  Japan .

*Primary Examiner*—Leo P. Picard
*Assistant Examiner*—Jayprakash N. Gandhi
*Attorney, Agent, or Firm*—Burns, Doane, Swecker & Mathis, LLP

[57] ABSTRACT

Disclosed is a method for manufacturing electronic parts in which the soldering operation, the operation of checking the soldering and the operation of mounting the shield cases are simplified and in which an improvement is achieved in terms of the dimensional accuracy of the electronic parts. Before a mother board is cut and divided, through-holes 14 formed around sections corresponding to substrates 2 are filled with solder 15. Next, legs 1c of shield cases 1 are inserted into the solder 15 such that they are brought into close contact with the inner peripheral surfaces of the through-holes 14, and the legs 1c are secured in position by reflow soldering. Then, the mother board is cut so as to separate the through-holes 14 (the solder 15), whereby electronic parts are obtained each of which is composed of a shield case 1 and a substrate 2 on the sides 2b and 2c of which the solder 15 is exposed.

10 Claims, 8 Drawing Sheets

METHOD FOR MANUFACTURING ELECTRONIC PARTS AND ELECTRONIC PARTS USING THE METHOD

BACKGROUND OF THE INVENTION

1. Field of the Invention

The present invention relates to a method for manufacturing an electronic part comprising a substrate on which an electronic circuit, such as an electronic tuner or a voltage control oscillator, is provided and a shield case covering the substrate. The present invention further relates to electronic parts using this method.

2. Description of the Related Art

Nowadays, as electronic apparatuses become smaller with their performance more improved, the substrate of an electronic part on which an electronic circuit is provided is covered with a shield case consisting of a plate material of pure iron, Permalloy or the like in order to prevent interference from or to another circuit.

A conventional method for manufacturing an electronic part equipped with a shield case will be described with reference to the drawings.

Figure 6:
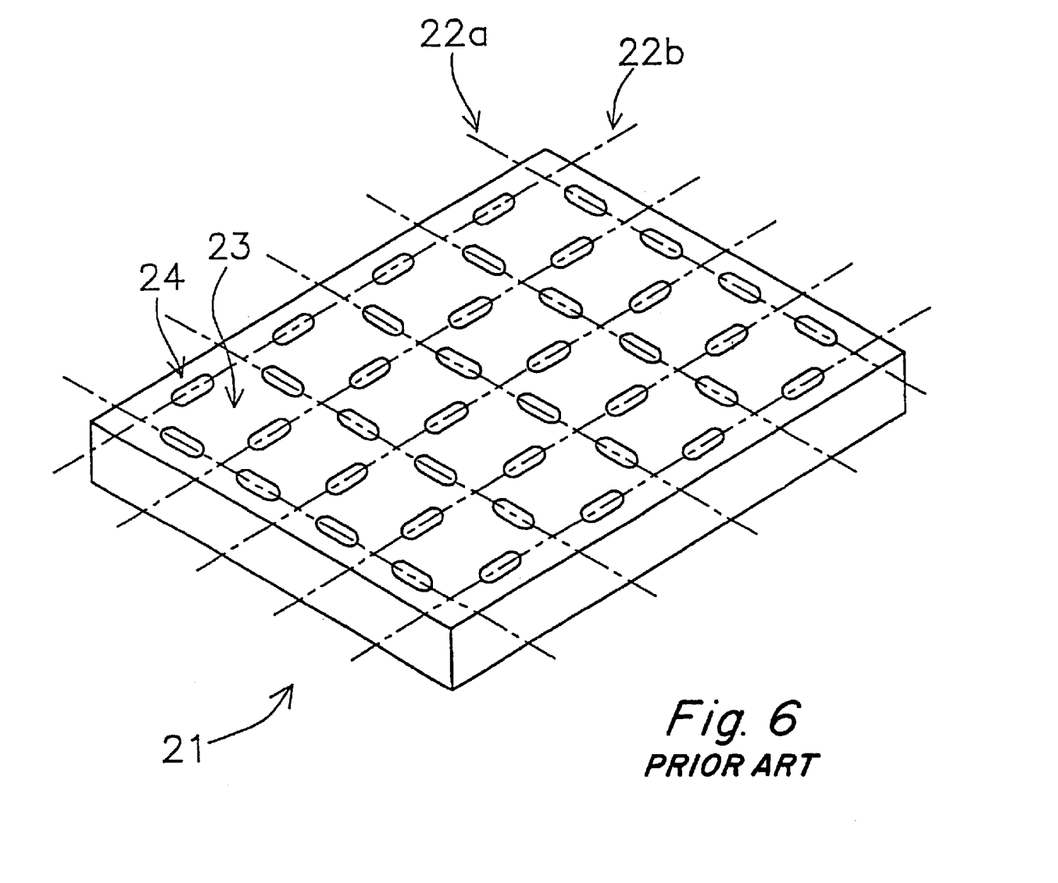
FIG. 6 is a perspective view of a mother board used in a conventional method for manufacturing electronic parts.

In FIG. 6, numeral 21 indicates a mother board which is to be separated into a plurality of substrates by being cut. The mother board 21 is formed by stacking together a plurality of ceramic sheets (not shown) on which electronic circuits are printed. By cutting the mother board 21 along border lines 22a and 22b, a number of substrates 23 constituting electronic parts 30 described later can be obtained.

Figure 7:
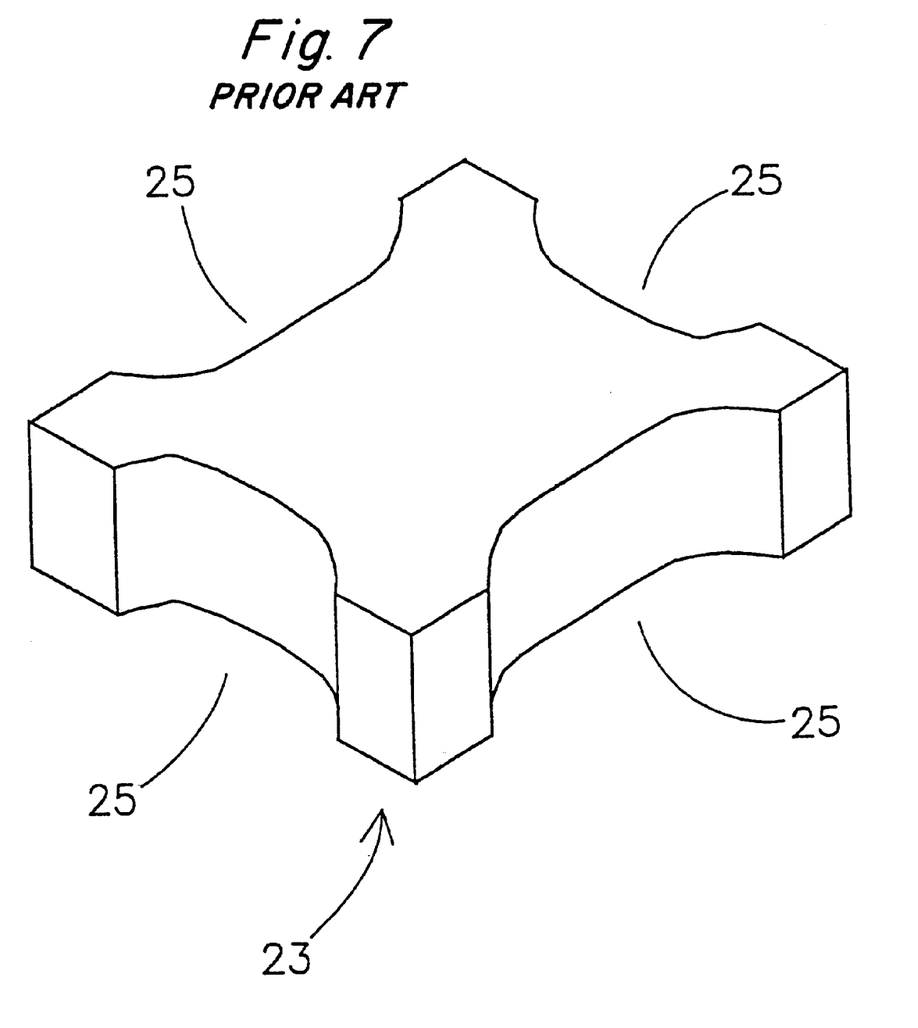
FIG. 7 is a perspective view of a substrate obtained by dividing the mother board shown in FIG. 6.

In this mother board 21, through-holes 24 having a substantially oval opening are provided such that they extend along the border lines 22a and 22b The mother board 21 is cut along the border lines 22a and 22b into a plurality of substrates 23. In this process, the through-holes 24 are divided, with the result that a recess 25 is formed on each side of each substrate 23, as shown in FIG. 7.

Figure 8:
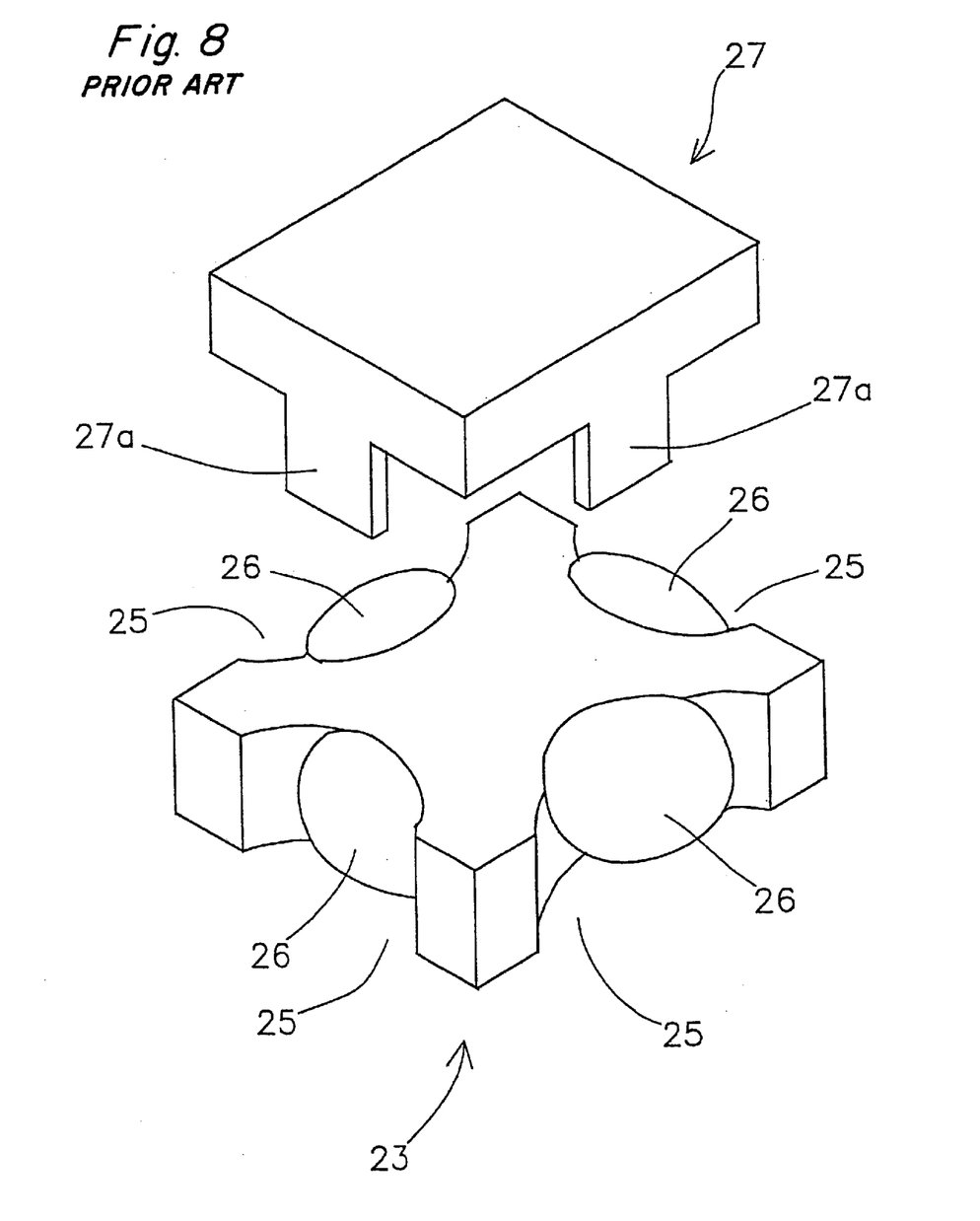
FIG. 8 is an exploded perspective view of an electronic part obtained by a conventional method for manufacturing electronic parts.

Next, as shown in FIG. 8, solder 26 is applied to each recess 25 by a soldering iron (not shown), and then a shield case 27 is attached to the substrate 23. The shield case 27 is formed of metal and is equipped with a plurality of legs 27a, which are fitted into the recesses 25 of the substrate 23.

Next, the solder 26 undergoes a reflow soldering process, whereby the legs 27a of the shield case 27 is secured to the recesses 25 of the substrate 23.

Figure 9:
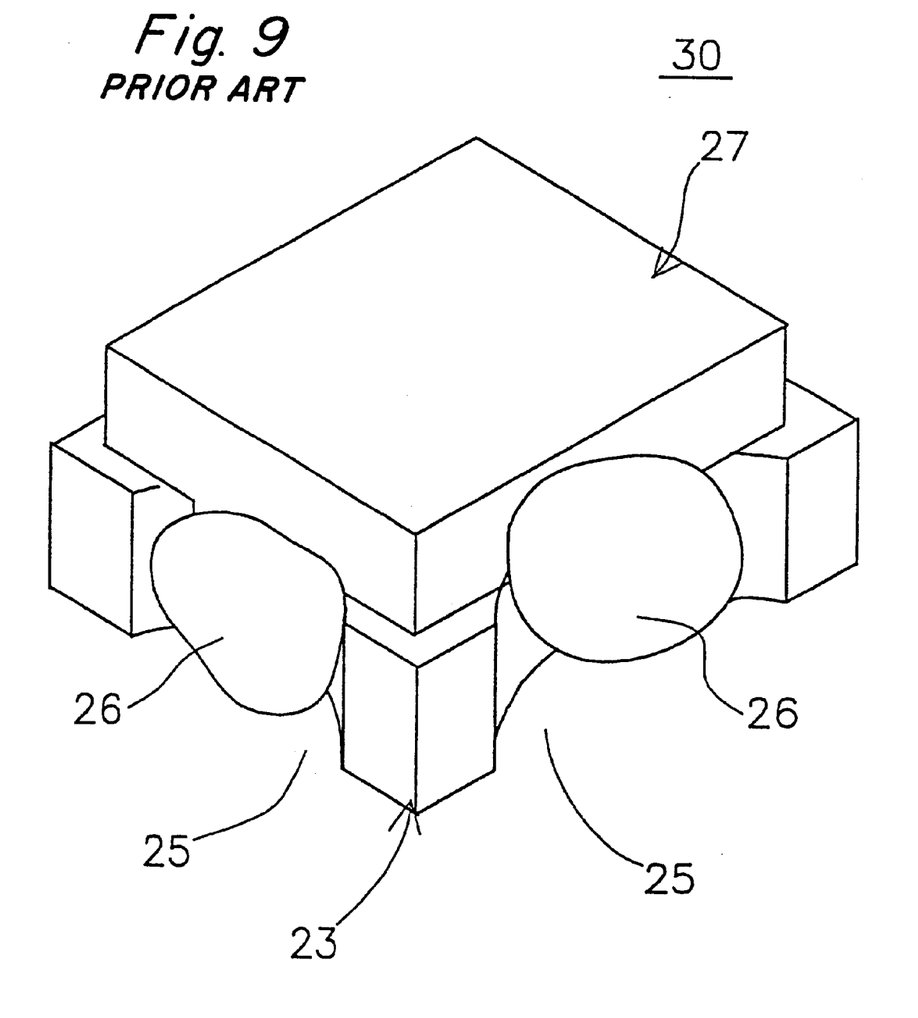
FIG. 9 is a perspective view of an electronic part obtained by a conventional method for manufacturing electronic parts.

In this way, as shown in FIG. 9, an electronic part 30 wherein a shield case 27 is mounted to a substrate is obtained.

In this conventional method for manufacturing electronic parts, since solder is applied to the recesses formed in each substrate, after separating the mother board, the soldering operation is troublesome.

Further, the application of solder, which is effected manually or by using a mechanic nozzle, is rather difficult to perform since the section where the solder is applied (recess) is small. As a result, in electronic parts obtained by such a manufacturing method, some solder is allowed to lie off the sides of the substrate, thereby generating so-called solder "bumps" or solder "horns", resulting in a deterioration in the dimensional accuracy of the electronic part, namely causing variation in outward dimensions.

Further still, the operation of attaching a shield case to each of the substrates obtained through separation is troublesome.

Moreover, each electronic part must be checked to make sure whether the attachment of the shield case by soldering has been properly performed, and this checking operation is troublesome.

SUMMARY OF THE INVENTION

Accordingly, it is an object of the present invention to provide a method for manufacturing electronic parts in which the soldering operation, the operation of checking whether the soldering has been properly effected, and the operation of mounting the shield case, are simplified and in which an improvement has been achieved in terms of the dimensional accuracy of the electronic parts obtained.

To achieve the above object, there is provided, in accordance with the present invention, a method for manufacturing electronic parts of the type wherein a mother board to be cut into a plurality of substrates, and a plurality of shield cases each of which includes a flat bottom portion, a frame portion connected to the bottom portion so as to be at right angles with respect thereto, and legs extending from the frame portion, are prepared, and the longitudinal and lateral dimensions of the bottom portion being smaller than those of the main surface of each of the substrates, the method comprising the steps of: providing through-holes along border lines dividing the mother board into the substrates; supplying solder to the inside of the through-holes; disposing the plurality of shield cases above the main surface of the mother board corresponding to the plurality of substrates, respectively; mounting the shield cases on the substrates by inserting the legs of each shield case into the through-holes such that they are positioned at the inner peripheral surface side of the through-holes from the border lines and securing them in position by fusing and hardening the solder; and cutting the mother board along the border lines.

Further, the present invention is characterized in that adjacent legs of the plurality of adjoining shield cases are inserted in the same through-hoes provided in the mother board.

According to the present invention, the step of supplying solder to the inside of the through-holes includes the step of applying solder to the inside of the through-holes.

Also, according to the present invention, an electronic part includes a substrate, a recess formed on side surfaces of the substrate, a shield case mounted so that the shield case covers the main surface of the substrate. The shield case includes a flat bottom portion, a frame portion connected to the bottom portion so as to be at right angles with respect thereto, and legs extending from the frame portion. The longitudinal and lateral dimensions of the bottom portion are smaller than those of the main surface of the substrate. Outer side surfaces of the legs of the shield case are disposed so that they are positioned at the inner peripheral surface side of the recess from side surfaces of the substrate. The legs of the recess are secured by solder. Exposed surfaces of the solder are positioned coplanar with the side surfaces of the substrate, or at the inner peripheral surface side of the recess from the side surfaces of the substrate.

In accordance with the method for manufacturing electronic parts of the present invention, the solder for securing the shield cases to the substrates is collectively supplied to the through-holes of the mother board before it is cut and separated, whereby the soldering operation is simplified.

Further, the operation of supplying solder to the through-holes of the mother board can be conducted simultaneously with the operation of supplying the mother board with solder for mounting circuit elements on the mother board, whereby the soldering operation is simplified.

Furthermore, it is possible to collectively determine whether the soldering has been properly effected before the mother board is cut and separated, whereby the checking operation is simplified.

Moreover, since the attachment of the shield cases is effected collectively before the mother board is cut and separated, the attaching operation is simplified. Further, since the mechanical equipment for attaching the shield cases may be the same as that for mounting the circuit elements on the substrates of the mother board, whereby a reduction in equipment cost can be achieved.

Also, since the adjacent legs of the adjoining shield cases are inserted in the same through-holes provided in the mother board, so-called "extra for cutting" needs not to be prepared between border lines when the mother board is cut along the through-holes into a plurality of substrates. Thus, many substrates can be obtained from one mother board without waste.

Further, since the solder supplied to the through-holes of the mother board is separated with the through-holes when cutting the mother board, there is no concern that some of the solder is allowed to lie off the sides of the individual substrates, thus generating so-called solder "bumps" or solder "horns", whereby an improvement is achieved in terms of the dimensional accuracy of the electronic parts.

Further, when solder is supplied such that the solder is filled in the through-holes of the mother board, a simple method like a screen printing of solder paste can be used, thereby simplifying the operation of supplying solder into through-holes.

Further still, when the solder is supplied to the through-holes of the mother board by applying it to the inner peripheral surfaces of the through-holes, the amount of solder used can be reduced as compared to the case in which the through-holes are filled with solder, whereby a reduction in cost can be achieved.

DESCRIPTION OF THE PREFERRED EMBODIMENTS

A method for manufacturing electronic parts according to a first embodiment of the present invention will be described with reference to the drawings.

Figure 1:
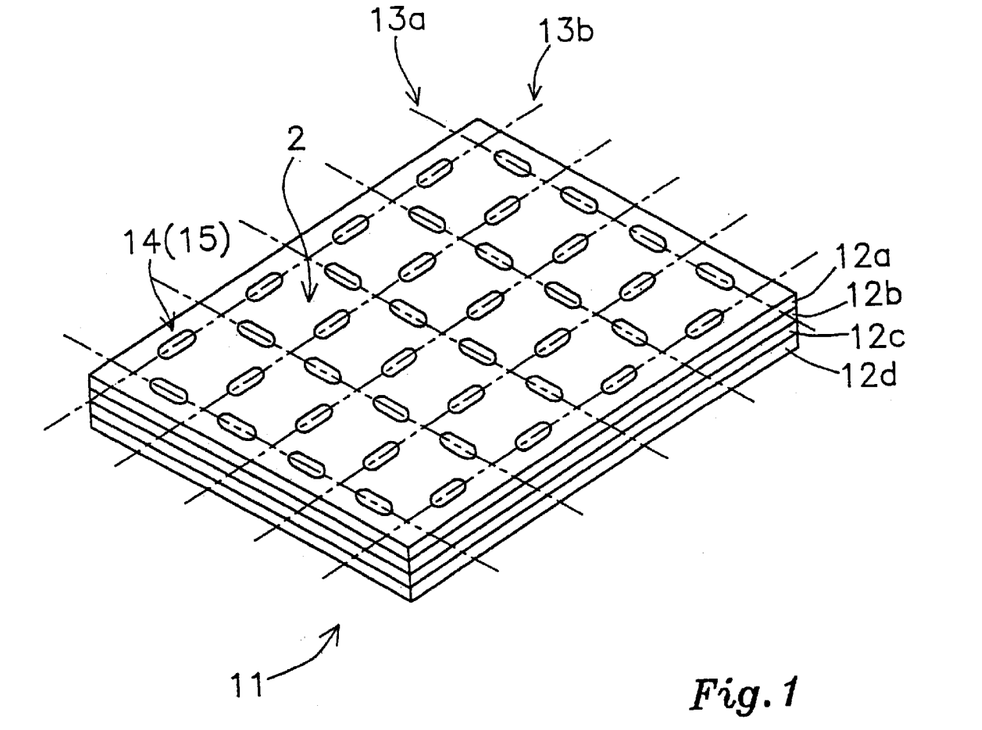
FIG. 1 is a perspective view of a mother board used in a method for manufacturing electronic parts according to an embodiment of the present invention.
Figure 2:
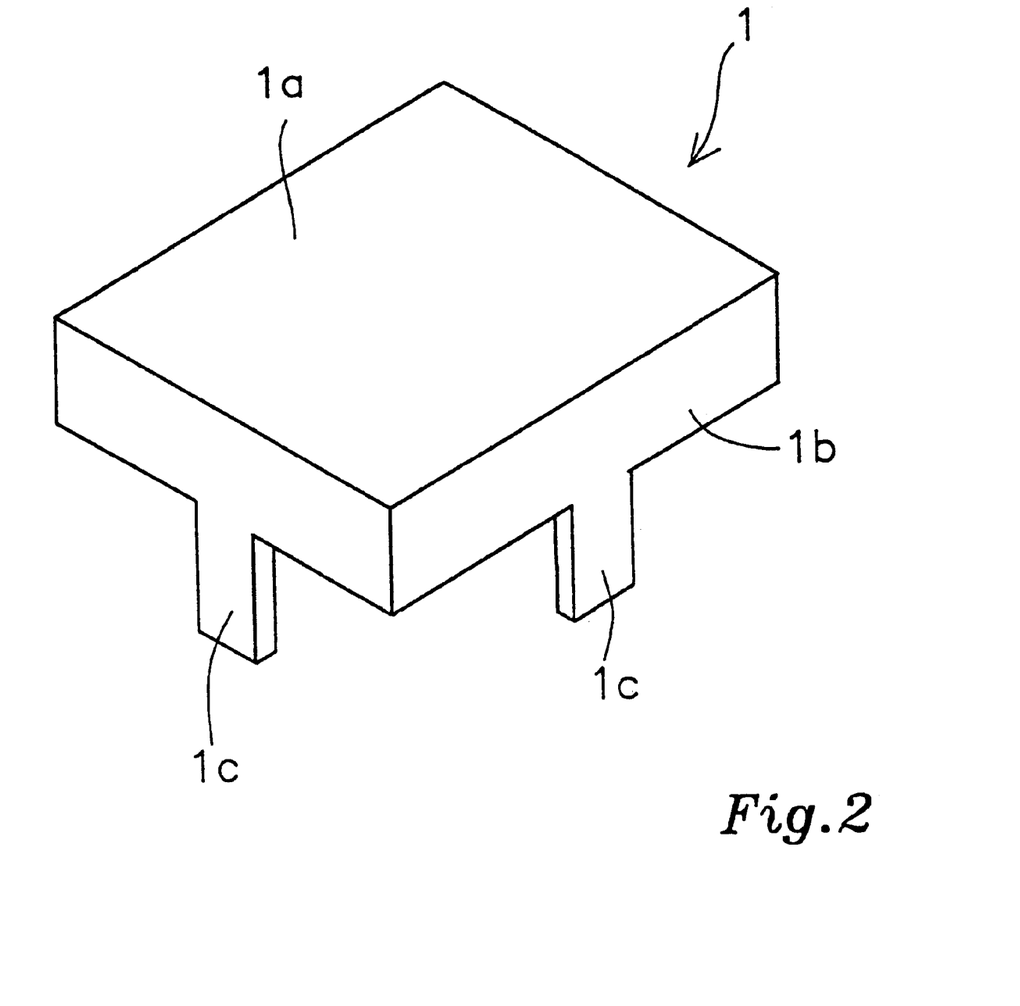
FIG. 2 is a perspective view of a shield case used in a method for manufacturing electronic parts according to an embodiment of the present invention.

First, a mother board 11, shown in FIG. 1, and a shield case 1, shown in FIG. 2, are prepared. The mother board 11 is formed by stacking together a plurality of ceramic sheets 12a, 12b, 12c and 12d. Electronic circuits are printed on the surface of the ceramic sheet 12a in correspondence with substrates 2 obtained through separation by border lines 13a and 13b. Electronic circuits are also printed on the ceramic sheets 12b, 12c and 12d. The electronic circuits of these ceramic sheets are connected to each other through via holes or the like. The electronic circuits and the via holes are not shown.

The shield case 1 is formed by bending a metal plate. It comprises a flat bottom portion 1a, a frame portion 1b connected to the bottom portion 1a so as to be at right angles with respect to it, and legs 1c extending from the frame portion 1b. As shown in FIG. 3, the longitudinal and lateral dimensions of the bottom portion 1a of the shield case 1 are smaller than the longitudinal and lateral dimensions of the main surfaces 2a of the substrates 2 obtained through division of the mother board 11 by the border lines 13a and 13b.

In the mother board 11, through-holes 14 having a substantially oval opening are provided so as to extend along the border lines 13a and 13b.

Next, a masking (not shown) corresponding to the openings of the through-holes 14 is effected on the surface of the mother board 11, and the through-holes 14 are collectively filled with solder 15 by screen printing the solder paste, in a manner similar to the printing of a conductor. The masking may correspond to the electronic circuits on the substrates 2, and solder for mounting circuit elements on the electronic circuits may be applied or filled at the same time.

Figure 3A:
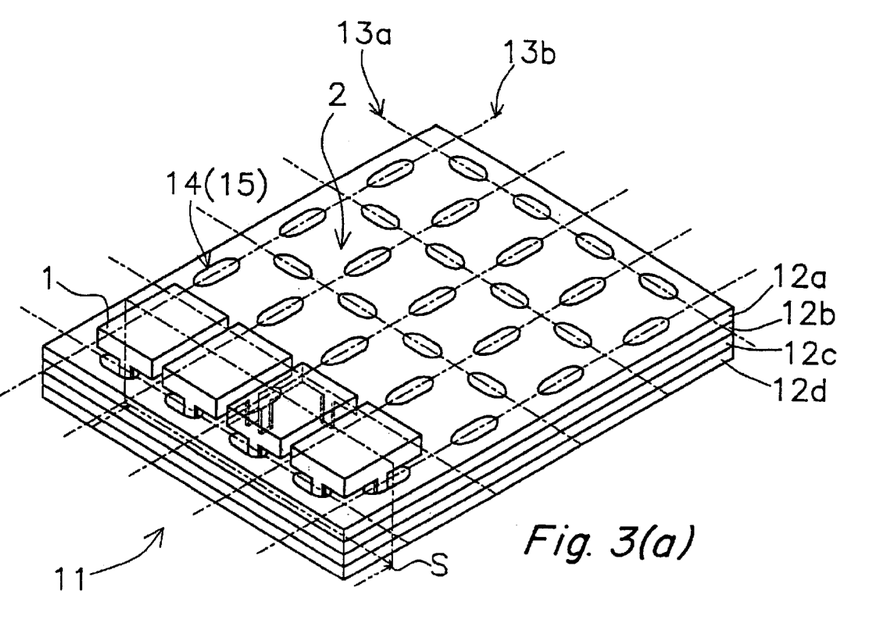
FIG. 3(a) is a perspective view and FIG. 3(b) is a sectional view at surface S, respectively, showing a state in which shield cases are mounted on a mother board according to an embodiment of manufacturing method of the present invention.
Figure 3B:
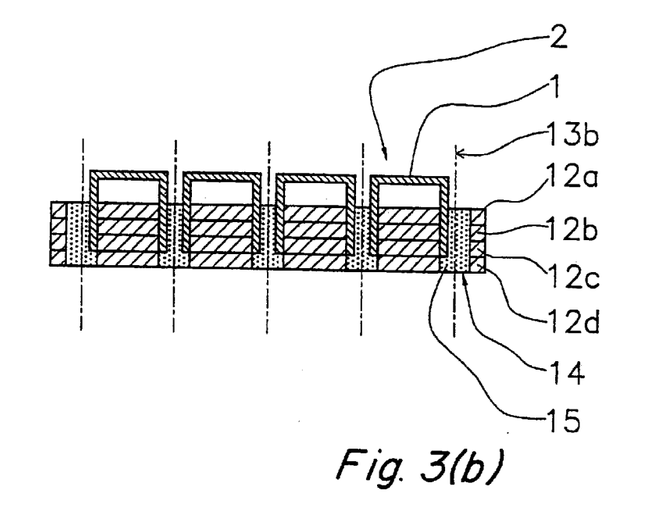

Next, after the circuit elements (not shown) have been mounted on the substrates 2 of the mother board 11, as shown in FIG. 3(a) and FIG. 3(b), a shield case 1 is mounted on each of the substrates 2. In this process, the legs 1c of the shield case 1 are inserted into through-holes 14 so that the outer side surfaces thereof are positioned at the inner-peripheral-surface sides of the through-holes 14 with respect to the border lines 13a and 13b. The legs 1c are inserted into the solder 15 with which the through-holes 14 are filled, whereby the shield case 1 is temporarily fastened to the mother board 11.

In FIG. 3(a), shield cases 1 are disposed with respect to four substrates 2, considering that the drawing can be easily seen. However, in practice, shield cases 1 are disposed corresponding to all of the substrates 2, respectively. Here, adjacent legs 1c of two adjoining shield cases 1 are inserted in the same through-holes 14 provided in the mother board 11.

Next, reflow soldering is effected so that the legs 1c of the shield cases 1 may be fused and hardened by means of the solder 15. This reflow soldering may be simultaneously effected with the reflow soldering for the circuit elements mounted on the substrates 2 of the mother board.

Figure 4:
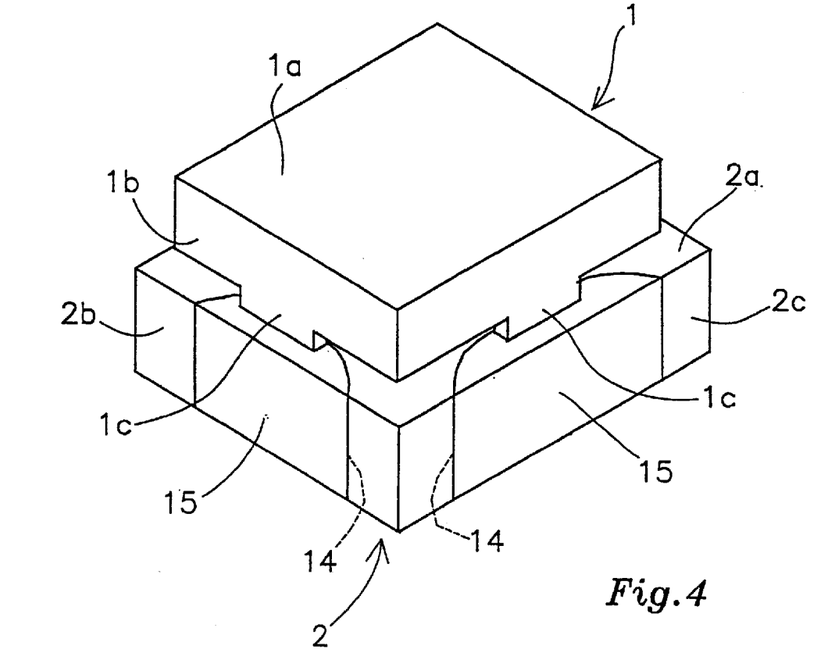
FIG. 4 is a perspective view of an electronic part obtained by a method for manufacturing electronic parts according to the present invention.

Next, the mother board 11 is cut along the border lines 13a and 13b by a dicing saw (not shown) and divided into individual substrates 2. As shown in FIG. 3(b), since the shield cases 1 are arranged on the inner sides of the border lines 13a and 13b, although two legs 1c of adjoining shield cases 1 are inserted in the same through-holes 14, respective substrate 2 on which the shield cases 1 are mounted can be obtained without making the dicing saw contact with the shield cases 1. As shown in FIG. 4, as a result of the division of the through-holes 14 and the solder 15, the solder 15 is exposed so as to be connected to part of the side surfaces 2b and 2c of the substrate 2. The outer side surfaces of the legs 1c of the shield case 1 are arranged at the inner side of the side surfaces 2b and 2c of the substrate 2. While in FIG. 4 the shield case 1 is shown as inserted halfway for convenience in illustration, the legs 1c of the shield case 1 are in reality inserted in the through-holes 14 (the solder 15) up to their roots, with the edges of the shield case 1 being in close contact with the main surface 2a of the substrate 2.

Figure 5:
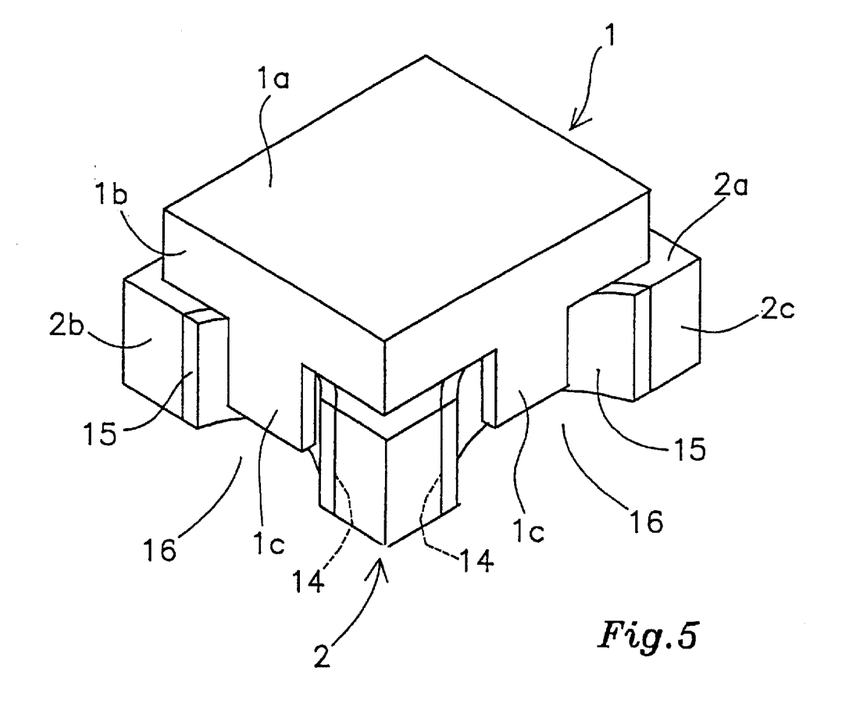
FIG. 5 is a perspective view of another electronic part obtained by a method for manufacturing electronic parts according to the present invention.

Instead of filling the through-holes 14 of the mother board 11 with the solder 15 for securing the shield case, it is also possible to apply the solder 15 to the inner peripheral surfaces of the through-holes 14. In this case, as shown in FIG. 5, recesses 16 are formed on the side surfaces 2b and 2c of the substrate 2 as a result of the division of the through-holes 14, the solder 15 being exposed on the inner peripheral surfaces of these recesses 16. The shield case 1 is mounted on the substrate 2, with its legs 1c being secured by means of the solder 15.

Electronic parts manufactured by the manufacturing method according to the present invention described above include a substrate, shown in FIG. 4 and FIG. 5. In these electronic parts, since the solder 15 with which the through-holes 14 of the mother board 11 is separated with the through-holes 14, there is no concern that some solder 15 is allowed to lie off the sides of the individual substrates 2, namely the sides of the electronic parts, resulting in the generation of so-called solder "bumps" or solder "horns," whereby the dimensional accuracy of the electronic parts is improved.

As described above, in accordance with the method for manufacturing electronic parts of this embodiment, the through-holes of the mother board are collectively filled with the solder for securing the shield cases to the substrates before the mother board is cut and separated, whereby the soldering operation is simplified.

Further, the operation of filling the through-holes of the mother board with solder can be conducted simultaneously with the operation of applying solder to the mother board or filling it therewith in order to mount circuit elements to the mother board, whereby the soldering operation is simplified.

Further still, the reflow soldering of the shield cases can be conducted simultaneously with the reflow soldering of the circuit elements to the mother board, thereby simplifying the soldering operation.

Moreover, since the attachment of the shield cases to the substrates is collectively effected before the mother board is cut and separated, the attaching operation can be simplified. Further, the mechanical equipment for the attachment of the shield cases may be the same as that for mounting the circuit elements on the substrates of the mother board, whereby a reduction in equipment cost can be achieved.

Furthermore, since it is possible to determine whether the soldering has been properly effected before the mother board is cut and separated, the checking operation can be simplified.

Moreover, since the solder with which the through-holes of the mother board are filled is separated with the through-holes when cutting the mother board, there is no concern that some solder is allowed to lie off the sides of the individual substrates, resulting in the generation of so-called solder "bumps" or solder "horns", whereby the dimensional accuracy of the electronic parts is improved.

Further, since the adjacent legs of a plurality of adjoining shield cases are inserted in the same through-holes provided in the mother board, so-called "extra for cutting" needs not to be prepared between border lines when the mother board is cut along the through-holes into a plurality of substrates. Thus, many substrates can be obtained from one mother board without waste.

Also, when solder is supplied such that solder is filled in the through-holes of the mother board, a simple method like a screen printing of solder paste can be used, thereby simplifying the operation of supplying solder into through-holes.

When the solder for securing the shield cases is applied to the inner peripheral surfaces of the through-holes of the mother board, the amount of solder used can be reduced as compared with the case in which the through-holes are filled with solder, whereby a reduction in cost can be achieved.

While in the above-described embodiment a mother board formed by stacking together a plurality of ceramic sheets is used, this should not be construed restrictively. Materials for a mother board is not restricted to ceramic sheets. For example, it is also possible to use a mother board formed by stacking together a plurality of sheets obtained by molding, for example, a glass epoxy type material or Teflon. It is also possible for the mother board having a single plate material.

The configuration of the openings of the through-holes of the mother board is not restricted to the substantially oval one. It is also possible, for example, to form through-holes having openings of a rectangular configuration.

In accordance with the method for manufacturing electronic parts of the present invention, the solder for securing the shield cases to the substrates is collectively supplied to the through-holes of the mother board before it is cut and separated, whereby the soldering operation is simplified.

Further, the operation of supplying solder to the through-holes of the mother board can be conducted simultaneously with the operation of applying solder for mounting the circuit elements to the mother board, whereby the soldering operation can be simplified.

Furthermore, since the attachment of the shield cases is effected collectively before the mother board is cut and separated, the attachment operation is simplified. Further, the mechanical equipment for the attachment of the shield cases may be the same as that for mounting the circuit elements to the substrates of the mother board, whereby an improvement in equipment cost can be achieved.

Moreover, since it is possible to collectively determine whether the solderinghas been properly effected before the mother board is cut and separated, the checking operation is simplified.

Further, since the adjacent legs of a plurality of adjoining shield cases are inserted in the same through-holes provided in the mother board, so-called "extra for cutting" needs not to be prepared between border lines when the mother board is cut along the through-holes into a plurality of substrates. Thus, many substrates can be obtained from one mother board without waste.

Further still, in the electronic parts manufactured by the method according to the present invention, since the solder with which the through-holes of the mother board are filled is separated with the through-holes when cutting the mother board, there is no concern that some solder is allowed to lie off the sides of the individual substrates, thus generating so-called solder "bumps" or solder "horns", whereby the dimensional accuracy of the electronic parts is improved.

Also, when solder is supplied such that the solder is filled in the through-holes of the mother board, a simple method like a screen printing of solder paste can be used, thereby simplifying the operation of supplying solder into through-holes.

Further, when the solder for securing the shield cases is applied to the inner peripheral surfaces of the through-holes of the mother board, the amount of solder used can be reduced as compared with the case in which the through-holes are filled with solder, whereby a reduction in cost can be achieved.

What is claimed is:

1. A method for manufacturing electronic parts, the electronic parts comprising substrates which are cut from a mother board and a plurality of shield cases each of which includes a flat bottom portion, a frame portion connected to the bottom portion so as to be at right angles with respect thereto, and legs extending from the frame portion, the longitudinal and lateral dimensions of the bottom portion being smaller than those of the main surface of each of the substrates, the method comprising the steps of:

providing through-holes along border lines dividing the mother board into the substrates;

supplying solder to the through-holes;

disposing said plurality of shield cases above the main surface of the mother board with respect to said plurality of substrates;

inserting the legs of the shield cases into the through-holes so that they are disposed at the inner peripheral surfaces of the through-holes from the border lines;

mounting the shield cases on the substrates respectively by fusing and hardening the solder so that the legs of the shield cases are secured at the inner peripheral surfaces of the through-holes; and cutting the mother board along the border lines after the step of mounting.

2. A method for manufacturing electronic parts according to claim 1, wherein adjacent legs of adjoining shield cases are inserted in the same through-holes provided in the mother board.

3. A method for manufacturing electronic parts according to claim 2, wherein the through-holes of the mother board are filled with solder.

4. A method for manufacturing electronic parts according to claim 2, wherein solder is applied to the inner peripheral surfaces of the through-holes of the mother board.

5. A method for manufacturing electronic parts according to claim 1, wherein the through-holes of the mother board are filled with solder.

6. A method for manufacturing electronic parts according to claim 1, wherein solder is applied to the inner peripheral surfaces of the through-holes of the mother board.

7. A method for manufacturing electronic parts according to claim 6, wherein said solder is applied so as to coat the inner peripheral surfaces of the through-holes so that exposed surfaces of the solder follow the contours of the through-holes.

8. An electronic part comprising:

a substrate;

recesses provided on respective side surfaces of the substrate;

a shield case mounted on a main surface of the substrate so as to cover the main surface of the substrate;

wherein, said shield case includes a flat bottom portion, a frame portion connected to the bottom portion so as to be at right angles with respect thereto, and legs extending from the frame portion;

longitudinal and lateral dimensions of the bottom portion are smaller than those of the main surface of the substrate;

the legs of the shield case are disposed within the recesses, such that their outer side surfaces are recessed from the side surfaces of the substrate;

the legs of the shield case and inner peripheral surfaces of the recess are secured by solder; and exposed surfaces of the solder extend no further than the planes formed by the side surfaces of the substrate.

9. An electronic part according to claim 8, wherein said exposed surfaces of the solder are coplanar with the side surfaces of the substrate.

10. An electronic part according to claim 8, wherein said exposed surfaces of the solder follow the contours of said recesses.

* * * * *